US011063199B2

(12) United States Patent
Fonda et al.

(10) Patent No.: US 11,063,199 B2
(45) Date of Patent: Jul. 13, 2021

(54) INTERNALLY HEATED CONCENTRATED SOLAR POWER (CSP) THERMAL ABSORBER

(71) Applicant: THE BOEING COMPANY, Chicago, IL (US)

(72) Inventors: James W. Fonda, Chicago, IL (US); John H. Belk, Chicago, IL (US)

(73) Assignee: The Boeing Company, Chicago, IL (US)

( * ) Notice: Subject to any disclaimer, the term of this patent is extended or adjusted under 35 U.S.C. 154(b) by 148 days.

(21) Appl. No.: 15/167,745

(22) Filed: May 27, 2016

(65) Prior Publication Data

US 2016/0276565 A1   Sep. 22, 2016

Related U.S. Application Data

(62) Division of application No. 12/618,616, filed on Nov. 13, 2009, now Pat. No. 9,356,218.

(51) Int. Cl.
*H01L 35/30* (2006.01)
*H01G 9/21* (2006.01)
(Continued)

(52) U.S. Cl.
CPC ............ *H01L 35/30* (2013.01); *G21H 1/103* (2013.01); *H01G 9/21* (2013.01); *H01L 31/028* (2013.01);
(Continued)

(58) Field of Classification Search
CPC .............. H02S 40/40–44; H01L 31/052–0525
See application file for complete search history.

(56) References Cited

U.S. PATENT DOCUMENTS 3,540,530 A    11/1970  Kritzer
4,002,031 A *   1/1977  Bell .................. F03G 6/001
                                                  126/698
(Continued)

OTHER PUBLICATIONS

Alkali-metal thermal to electric converter, Wikipedia, the free encyclopedia, Oct. 24, 2009. http://en.wikipedia.org/wiki/Alaki-metal_thermal_to_electric_converter.
(Continued)

*Primary Examiner* — Eric R Smith
(74) *Attorney, Agent, or Firm* — Haynes and Boone, LLP (57) ABSTRACT

A system and method are disclosed for internally heated concentrated solar power (CSP) thermal absorbers. The system and method involve an energy-generating device having at least one heating unit. At least one heating unit preheats the energy-generating device in order to expedite the startup time of the energy-generating device, thereby allowing for an increase in efficiency for the production of energy. In some embodiments, the energy-generating device is a CSP thermal absorber. The CSP thermal absorber comprises a housing, a thermal barrier, a light-transparent reservoir containing a liquid alkali metal, at least one alkali metal thermal-to-electric converter (AMTEC) cell, an artery return channel, and at least one heating unit. Each heating unit comprises a heating device and a metal fin. The metal fin is submerged into the liquid alkali metal, thereby allowing the heating device to heat the liquid alkali metal via the fin.

24 Claims, 4 Drawing Sheets

(51) Int. Cl.
*G21H 1/10* (2006.01)
*H01L 35/20* (2006.01)
*H01L 35/32* (2006.01)
*H01L 35/34* (2006.01)
*H02S 40/40* (2014.01)
*H01L 31/028* (2006.01)
*H01L 31/0304* (2006.01)
*H01L 35/02* (2006.01)
*H02N 3/00* (2006.01)

(52) U.S. Cl.
CPC .......... *H01L 31/0304* (2013.01); *H01L 35/02* (2013.01); *H01L 35/20* (2013.01); *H01L 35/32* (2013.01); *H01L 35/34* (2013.01); *H02S 40/40* (2014.12); *H02N 3/00* (2013.01); *Y02E 10/40* (2013.01)

(56) References Cited

U.S. PATENT DOCUMENTS

| | | | |
|---|---|---|---|
| 4,172,740 A * | 10/1979 | Campbell, III | H01L 31/035281 136/206 |
| 4,808,240 A | 2/1989 | Sievers | |
| 5,518,554 A | 5/1996 | Newman | |
| 5,928,436 A | 7/1999 | Borkowski et al. | |
| 5,932,885 A | 8/1999 | DeBellis et al. | |
| 6,018,122 A * | 1/2000 | Hibino | G01S 3/7861 136/246 |
| 6,043,426 A * | 3/2000 | DePoy | H01L 31/02167 136/206 |
| 6,080,927 A * | 6/2000 | Johnson | F24S 20/20 136/248 |
| 6,239,350 B1 | 5/2001 | Sievers et al. | |
| 6,313,391 B1 | 11/2001 | Abbott | |
| 6,461,148 B1 | 10/2002 | Scotto et al. | |
| 2003/0201006 A1 | 10/2003 | Sievers et al. | |
| 2009/0145474 A1* | 6/2009 | Pang | H02S 40/44 136/248 |
| 2009/0159115 A1* | 6/2009 | Banin | H02S 40/44 136/248 |

OTHER PUBLICATIONS

Lodhi, M.A.K. et al., An overview of advanced spaced/terrestrial power generation device: AMTEC, 2001, Journal of Power Sources, 103, pp. 25-33.

* cited by examiner

INTERNALLY HEATED CONCENTRATED SOLAR POWER (CSP) THERMAL ABSORBER

CROSS-REFERENCE TO RELATED APPLICATION

This application is a Divisional application of, and claims the benefit of, U.S. patent application Ser. No. 12/618,616, filed Nov. 13, 2009, which is hereby incorporated by reference in its entirety.

BACKGROUND

The present disclosure relates to concentrated solar power (CSP) thermal absorbers. In particular, it relates to internally heated concentrated solar power (CSP) thermal absorbers.

SUMMARY

The present disclosure relates to a system, apparatus, and method for internally heated concentrated solar power (CSP) thermal absorbers. In one or more embodiments, the internally heated energy generating system involves an energy-generating device having at least one heating unit. At least one heating unit preheats the energy-generating device in order to expedite the startup time of the energy-generating device, thereby allowing for an increase in efficiency for the production of energy.

In one or more embodiments, the energy-generating device is a concentrated solar power (CSP) thermal absorber. In some embodiments, the concentrated solar power (CSP) thermal absorber comprises a housing that includes a thermal barrier. The thermal barrier divides the interior of the housing into a hot chamber and a cold chamber. The concentrated solar power (CSP) thermal absorber further comprises a light-transparent reservoir located in the hot chamber of the housing. In addition, the light-transparent reservoir contains a liquid alkali metal. Further, the concentrated solar power (CSP) thermal absorber comprises at least one alkali metal thermal-to-electric converter (AMTEC) cell disposed within the thermal barrier such that one end of the AMTEC cell is located in the cold chamber and the other end of the AMTEC cell is located in the hot chamber. Also, the concentrated solar power (CSP) thermal absorber further comprises an artery return channel that allows for the alkali metal to return from the cold chamber to the hot chamber.

In at least one embodiment, each heating unit, of the internally heated energy generating system, comprises a heating device that generates heat and a fin. One end of the fin is connected to an end of the heating device and the opposite end of the fin is submerged into the liquid alkali metal, thereby allowing the heating device to heat the liquid alkali metal via the fin. In one or more embodiments, the fin is manufactured from metal.

In one or more embodiments, each heating unit, of the internally heated energy generating system, comprises a heating device, where one end of the heating device is submerged into the liquid alkali metal, thereby allowing the heating device to heat the liquid alkali metal. In alternative embodiments, the heating device is attached to the end of the AMTEC cell that is located in the hot chamber.

In other embodiments, each heating unit comprises a heating element. Each heating element is attached to the outside of the light-transparent reservoir, plated to the outside of the light-transparent reservoir, mounted to the outside of the light-transparent reservoir, attached to the inside of the light-transparent reservoir, plated to the inside of the light-transparent reservoir, or mounted to the inside of the light-transparent reservoir, such that each heating element is able to heat the liquid alkali metal.

In some embodiments, the energy-generating device, of the internally heated energy generating system, is a solar cell. In one or more embodiments, the solar cell is manufactured from Gallium Arsenide (GaAs). In at least one embodiment, the solar cell is manufactured from Silicon (Si). In some embodiments, the energy-generating device is a thermoelectric power generator. In at least one embodiment, each heating unit, of the internally heated energy generating system, comprises a heating device that is attached onto the hot end of the thermoelectric power generator, wrapped around the hot end of the thermoelectric power generator, plated onto the hot end of the thermoelectric power generator, or integrated into the hot end of the thermoelectric power generator.

In one or more embodiments, a method for providing an internally heated energy generating system comprises providing an energy-generating device having at least one heating unit; and preheating the energy-generating device with at least one heating unit in order to expedite the startup time of the energy-generating device, thereby allowing for an increase in efficiency for the production of energy.

In some embodiments, the internally heated energy generating system comprises an energy-generating device having at least one heating unit, where at least one heating unit heats the energy-generating device in order to produce energy, thereby creating a thermal battery.

DRAWINGS

These and other features, aspects, and advantages of the present disclosure will become better understood with regard to the following description, appended claims, and accompanying drawings where:

DESCRIPTION

The methods and apparatus disclosed herein provide an operative system for concentrated solar power (CSP) thermal absorbers. Specifically, this system allows for internally heated concentrated solar power (CSP) thermal absorbers. The system of the present disclosure adds heating units to concentrated solar power (CSP) thermal absorbers in order to preheat the concentrated solar power (CSP) thermal absorbers. This allows for a reduction in system down time and a reduction in system startup time from the system being in an off state or when the system is located in a cold environment. The heating units simply increase the temperature of the thermal absorber. This, in turn, allows the AMTEC cells of the thermal absorber to work more efficiently, thereby resulting in production of electricity earlier in the day.

The system of the present disclosure adds a heat source to a concentrated solar power (CSP) thermal absorber. Concentrated solar power (CSP) thermal absorbers only function efficiently once the thermal absorber reaches a temperature sufficient to provide a large temperature gradient. This can occur hours after daylight begins, thereby reducing the number of usable hours for a concentrated solar power (CSP) system in the field. As such, the addition of heating units to concentrated solar power (CSP) thermal absorbers can increase the amount of kilowatt hours that the concentrated solar power (CSP) can provide per day.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
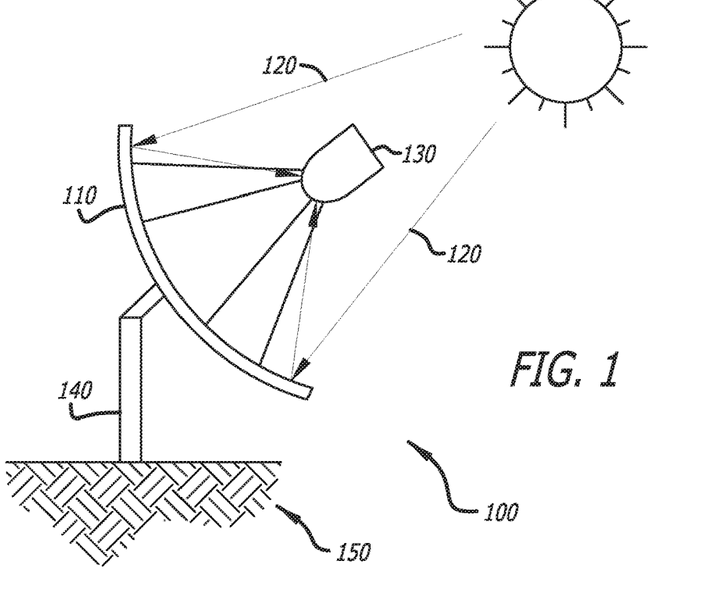
FIG. 1 is an illustration of a internally heated concentrated solar power (CSP) thermal absorber system, in accordance with at least one embodiment of the present disclosure.

Concentrated solar power (CSP) thermal absorber systems typically employ optical elements, such as mirrors and/or lenses. These optical elements are used to focus a large area of received sunlight into a concentrated location. FIG. 1 contains an illustration of an internally heated concentrated solar power (CSP) thermal absorber system 100, in accordance with at least one embodiment of the present disclosure. FIG. 1 shows a concentrated solar power (CSP) thermal absorber system 100 that utilizes a mirror 110 to focus the sunlight rays 120 onto the concentrated solar power (CSP) thermal absorber 130. In this figure, the mirror 110 is supported by a stand 140 that is secured into the ground 150.

Figure 2:
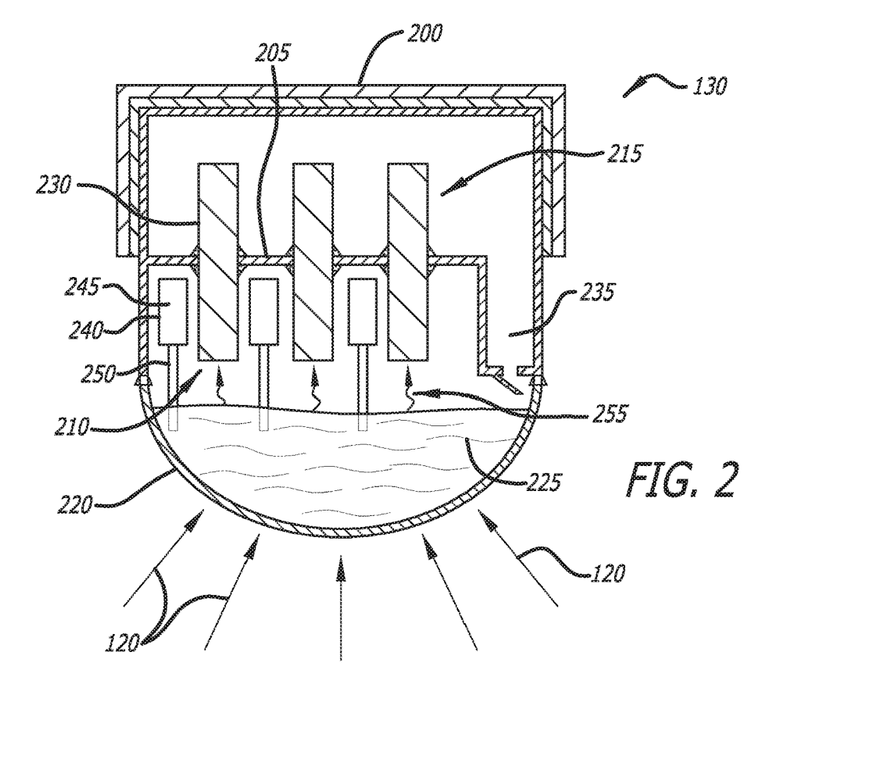
FIG. 2 shows a cross-sectional side view of an internally heated concentrated solar power (CSP) thermal absorber, in accordance with at least one embodiment of the present disclosure.

FIG. 2 shows a cross-sectional side view of an internally heated concentrated solar power (CSP) thermal absorber 130, in accordance with at least one embodiment of the present disclosure. In one or more embodiments, the internally heated concentrated solar power (CSP) thermal absorber 130 comprises a housing 200 that includes a thermal barrier 205. The thermal barrier 205 divides the interior of the housing into a hot chamber 210 and a cold chamber 215. In addition, the thermal barrier 205 creates a thermal resistance between the hot chamber 210 and the cold chamber 215. Also, a light-transparent reservoir 220 is located in the hot chamber 210 of the housing 200. The light-transparent reservoir 220 contains a liquid alkali metal 225, such as liquid sodium (Na) metal. In alternative embodiments, various other liquid alkali metals may be used for the disclosed system including, but not limited to, lithium (Li), potassium (K), and rubidium (Rb). In addition, for the present system, the liquid alkali metal 225 may be substituted with various other materials that are capable of providing the same function in the concentrated solar power (CSP) thermal absorber 130.

The internally heated concentrated solar power (CSP) thermal absorber 130 further comprises at least one alkali metal thermal-to-electric converter (AMTEC) cell 230. Each AMTEC cell 230 is disposed within the thermal barrier 205 such that one end of the AMTEC cell 230 is located in the cold chamber 215 and the other end of the AMTEC cell 230 is located in the hot chamber 210. In addition, the internally heated concentrated solar power (CSP) thermal absorber 130 includes an artery return channel 235. The artery return channel 235 allows for the liquid alkali metal 225 to return from the cold chamber 215 to the hot chamber 210 of the housing 200.

Additionally, the internally heated concentrated solar power (CSP) thermal absorber 130 further comprises at least one heating unit 240. Each heating unit 240 includes a heating device 245 that generates heat and a fin 250. One end of the fin 250 is connected to an end of the heating device 245, and the opposite end of the fin 250 is submerged into the liquid alkali metal 225. The heating device 245 of the heating unit 240 heats the liquid alkali metal 225 via the fin 250. In one or more embodiments, the fin 250 is manufactured from metal.

In alternative embodiments, the fin 250 may be manufactured from various other heat conducting materials that are suitable to be used with the disclosed system. In one or more embodiments, various types of heaters may be employed for the heating units 240 of the present disclosure. Types of heater that may be used for the heating units 240 include, but are not limited to, simple cylindrical heaters and resistive traces in the simplest version. In addition, in alternative embodiments, the heating units 240 may be installed at various other locations of the concentrated solar power (CSP) thermal absorber 130. However, the heating units 240 need to be placed at locations that minimize shadowing of the AMTEC cells 230, minimize disturbance of the flow of the thermal absorber heat transfer material, and optimize uniformly heating the same fluid.

In other embodiments, each heating unit 240 simply comprises a heating device 245 that generates heat. In some of these embodiments, the heating device 245 is submerged directly into the liquid alkali metal 225. As such, the heating device 245 is able to directly heat the liquid alkali metal 225. In other embodiments, the heating device 245 is attached to the end of the AMTEC cell 230 that is located in the hot chamber 210 of the housing 200. In these embodiments, the heating device 245 is located at a distance close enough to allow for the heating device 245 to heat the liquid alkali metal 225.

During daylight operation of the internally heated concentrated solar power (CSP) thermal absorber 130, sunlight rays 120 penetrate through the light-transparent reservoir 220 to heat the liquid alkali metal 225. The heat from the sunlight rays 120 causes the liquid alkali metal 225 to vaporize. The alkali metal vapors 255 enter into the bottom end of each AMTEC cell 230. If the internally heated concentrated solar power (CSP) thermal absorber 130 is being operated from a cold start up state, in a cold environment, or with no sunlight, the heating devices 245 of the heating units 240 use the fins 250 to supplementary heat or entirely heat the liquid alkali metal 225 to a vaporized state.

Figure 3:
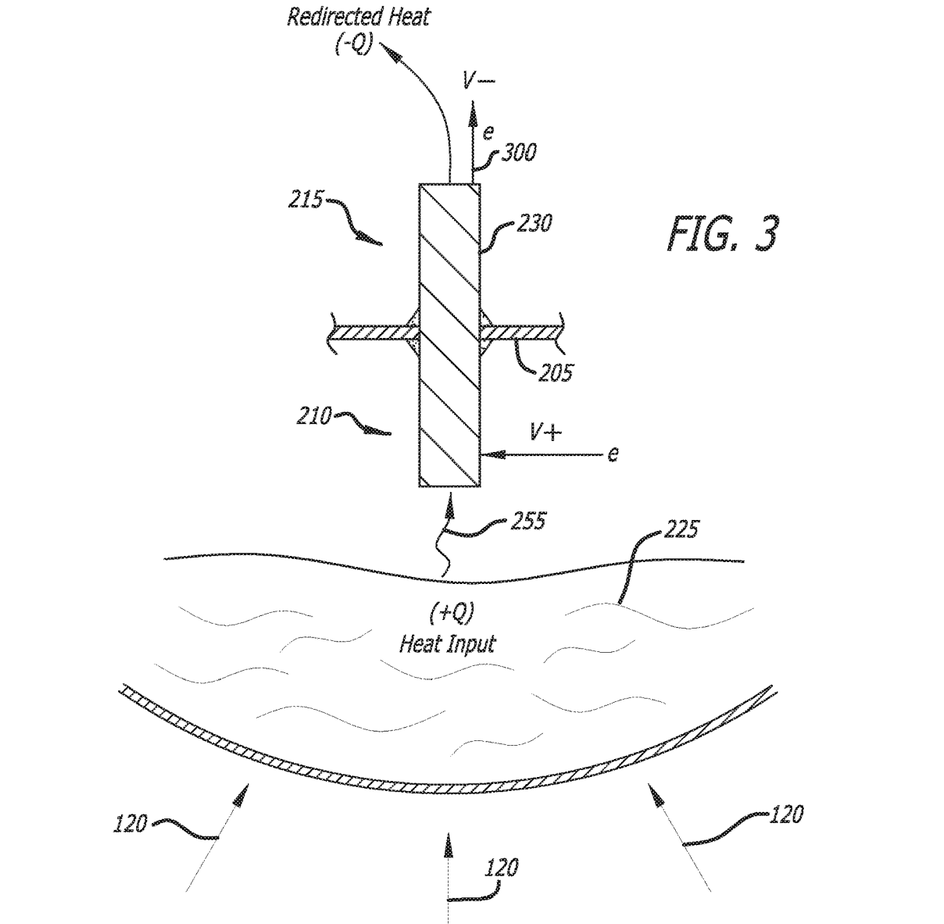
FIG. 3 is a depiction of a single alkali metal thermal-to-electric converter (AMTEC) cell, in accordance with at least one embodiment of the present disclosure.

FIG. 3 is a depiction of a single alkali metal thermal-to-electric converter (AMTEC) cell 230, in accordance with at least one embodiment of the present disclosure. During operation of the AMTEC cell 230, when the liquid alkali metal 225 is heated in the hot chamber 210, the alkali metal releases electrons (+Q) which pass through a load circuit, and the corresponding alkali metal ions (−Q) from the alkali metal pass through an electrolyte of the AMTEC cell 230 into the cold chamber 215, thereby generating an electrical current. As such, as the alkali metal vapors 255 travel through the AMTEC cell 230 from the hot chamber 210 to the cold chamber 215, an electrical potential is created. Electrical leads 300 are connected to the AMTEC cell 230. These electrical leads 300 are used to harness the electricity that is generated by the AMTEC cell 230.

In the cold chamber 215, alkali metal ions (−Q) are neutralized by the electrons (+Q) returning from the load circuit to yield condensed liquid alkali metal 225. The condensed liquid alkali metal 225 passes through the artery return channel 235 (refer to FIG. 2) to be recycled to the hot chamber 210 of the system.

It should be noted that various types of concentrated solar power (CSP) thermal absorbers 130 may be employed for the disclosed system. Examples of concentrated solar power (CSP) thermal absorbers 130 that may be employed by the system of the present disclosure include, but are not limited to, the systems disclosed in U.S. patent application Ser. No. 12/537,346 by Mark D. Bennett, which was filed on Aug. 7, 2009, the disclosure of which is incorporated by reference. It should be noted that this patent application is assigned to the assignee of the present application.

Figure 4:
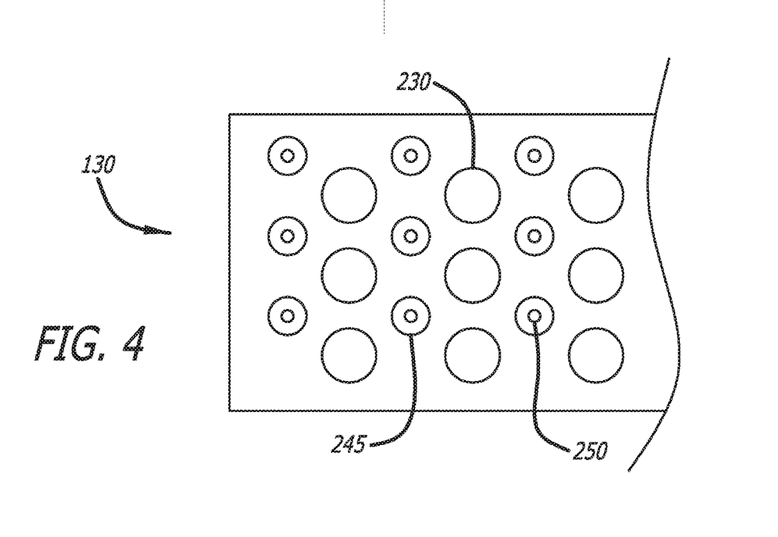
FIG. 4 shows a cross-sectional top view of an internally heated concentrated solar power (CSP) thermal absorber, in accordance with at least one embodiment of the present disclosure.

FIG. 4 shows a cross-sectional top view of an internally heated concentrated solar power (CSP) thermal absorber, in accordance with at least one embodiment of the present disclosure. This figure shows, for at least one embodiment, the placement of AMTEC cells 230, heating devices 245, and fins 250 within the internally heated concentrated solar power (CSP) thermal absorber 130. In alternative embodiments, the internally heated concentrated solar power (CSP) thermal absorber 130 of the present disclosure may have a different arrangement of the AMTEC cells 230 and/or the heating units 240, and may contain more or less AMTEC cells 230 and/or heating units 240 than as are depicted in FIG. 4.

Figures 5A, 5B:
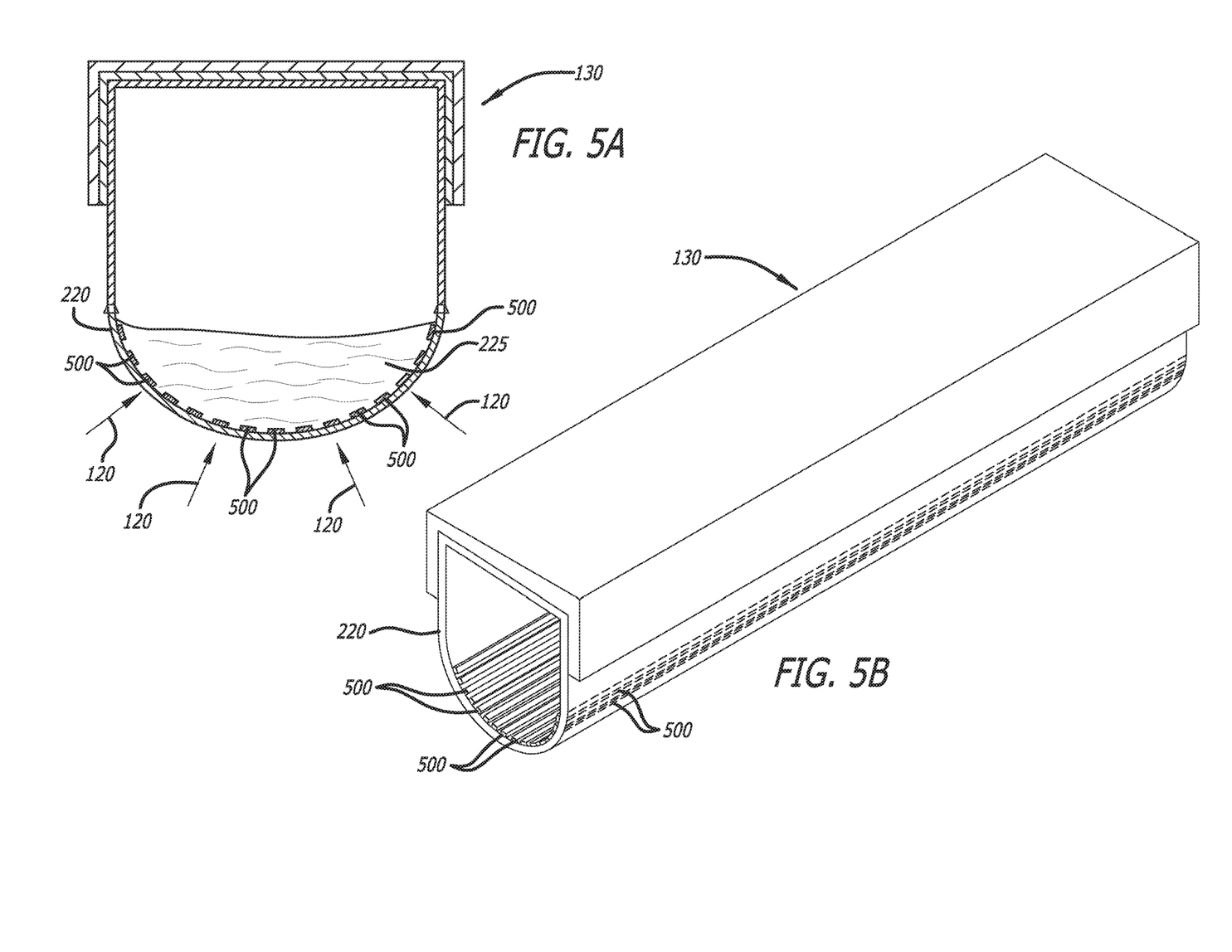
FIG. 5A is an illustration of a cross-sectional side view of an internally heated concentrated solar power (CSP) thermal absorber that includes a plurality of heating elements, in accordance with at least one embodiment of the present disclosure.
FIG. 5B shows an another view of an internally heated concentrated solar power (CSP) thermal absorber that includes a plurality of heating elements, in accordance with at least one embodiment of the present disclosure.

FIGS. 5A and 5B show two different views of an internally heated concentrated solar power (CSP) thermal absorber 130 that includes a plurality of heating elements 500, in accordance with at least one embodiment of the present disclosure. In this embodiment, each heating unit 240 of the present system is implemented as a heating element 500. The heating elements 500 depicted in these figures are resistive heating elements 500 that are used to preheat the liquid alkali metal 225. In one or more embodiments, the heating elements 500 are attached to the outside of the light-transparent reservoir 220, plated to the outside of the light-transparent reservoir 220, mounted to the outside of the light-transparent reservoir 220, attached to the inside of the light-transparent reservoir 220, plated to the inside of the light-transparent reservoir 220, and/or mounted to the inside of the light-transparent reservoir 220.

For various embodiments, the heating elements 500 may be implemented in the present system in many different shapes. However, the shapes for the heating elements 500 must be chosen such that the heating elements 500 minimize the obstruction of sunlight 120 as it illuminates the liquid alkali metal 225. In one or more embodiments, the heating elements 500 are nichrome wires that are plated on the inner surface of the light-transparent reservoir 220. In other embodiments, the heating elements 500 are solid patches of a transparent conductor material. Types of transparent conductor materials that may be used for the heating elements 500 of these embodiments include, but are not limited to, indium tin oxide or a conductive nanoparticles material in a carrier coating.

Figure 6:
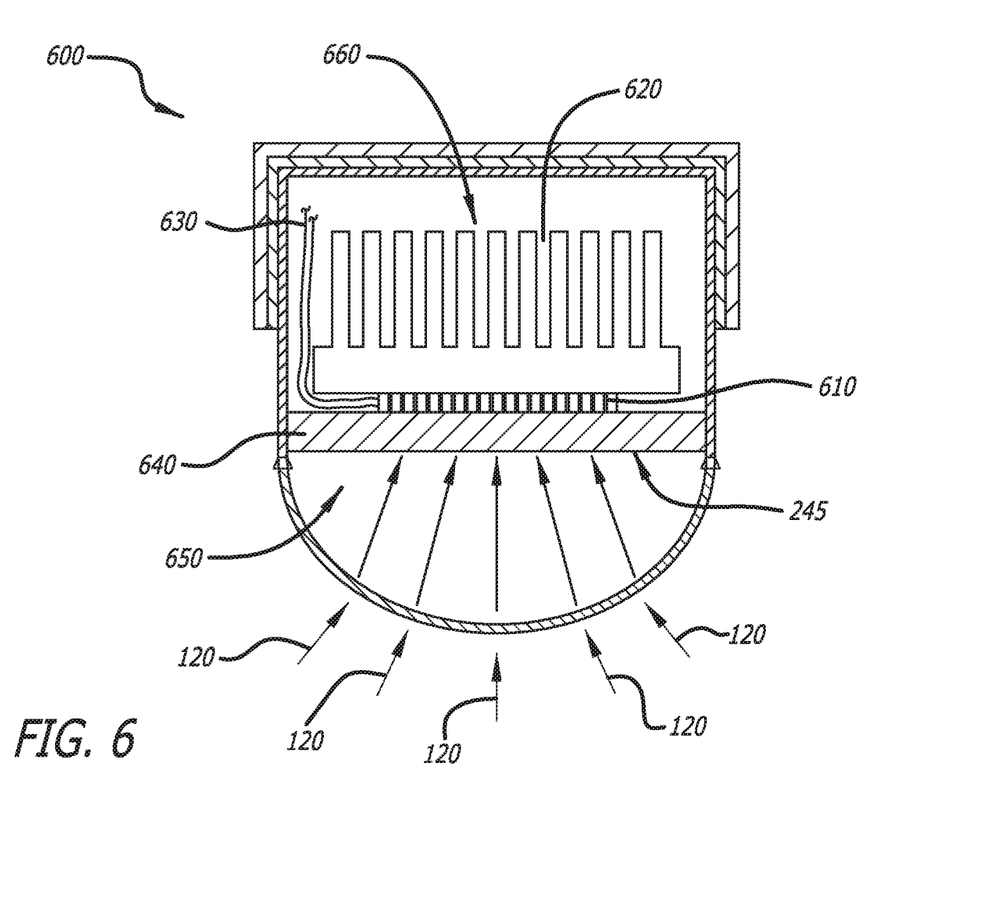
FIG. 6 shows a cross-sectional side view of a thermoelectric power generator, in accordance with at least one embodiment of the present disclosure.

FIG. 6 shows a cross-sectional side view of a thermoelectric (TE) power generator 600, in accordance with at least one embodiment of the present disclosure. In one or more embodiments, a thermoelectric power generator is employed for the energy-generating device of the disclosed system. The thermoelectric (TE) power generator 600 of this figure includes a TE module 610, a cold side heat sink 620, two leads 630 for electrical output, and a thermal mass 640. The thermoelectric (TE) power generator 600 is bisected into a hot end 650 and a cold end 660. The TE module 610 comprises a pair of flat plates and a plurality of semiconductor pillars located between the two plates. During daylight operation of the thermoelectric (TE) power generator 600, sunlight rays 120 heat the thermal mass 640, thereby causing the TE module 610 to generate electricity that is output via the two leads 630.

If the thermoelectric (TE) power generator 600 is being operated from a cold start up state, in a cold environment, or with no sunlight, heating devices 245 provide supplementary heat or entirely heat the thermal mass 640, thereby allowing the TE module 610 to generate electricity quickly and efficiently. In one or more embodiments, undulating resistor elements are employed for the heating devices 245 of the present system. The undulating resistor elements are attached to the surface of the thermal mass 640 and have two attached leads for electrical input. In one or more embodiments, the heating devices 245 are attached onto the hot end 650 of the thermoelectric power generator 600, wrapped around the hot end 650 of the thermoelectric power generator 600, plated onto the hot end 650 of the thermoelectric power generator 600, or integrated into the hot end 650 of the thermoelectric power generator 600.

In alternative embodiments, the energy-generating device, of the internally heated energy generating system, is a solar cell. In some embodiments, the solar cell is manufactured from Gallium Arsenide (GaAs). In alternative embodiments, the solar cell of the present system may be manufactured from various other semiconductor materials including, but not limited to, silicon (Si).

In some embodiments, the internally heated energy generating system comprises an energy-generating device having at least one heating unit, where at least one heating unit heats the energy-generating device in order to produce energy, thereby creating a thermal battery. In these embodiments, the heated energy generating system may be operated either in sunlight or non-sunlight conditions.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. An internally heated energy generating system, comprising:
   a housing;
   a light-transparent reservoir, comprising a material that is transparent to sunlight rays, that forms a portion of a curved exterior side of the housing and is configured to allow the sunlight rays to enter into the housing by penetrating through the curved exterior side of the housing;
   an energy generating device; and at least one heating unit configured to preheat the energy generating device to expedite a startup time of the energy generating device to increase efficiency of a production of energy, wherein the at least one heating unit each comprises a heating device that generates heat and a fin, wherein one end of the fin is connected to an end of the heating device and an opposite end of the fin is submerged into a liquid contained within the light-transparent reservoir, thereby allowing the heating device to heat the liquid via the fin, wherein the liquid is a liquid alkali metal.

2. The internally heated energy generating system of claim 1, wherein the energy generating device comprises a concentrated solar power (CSP) thermal absorber.

3. The internally heated energy generating system of claim 2, wherein the concentrated solar power (CSP) thermal absorber comprises:
the housing that comprises a thermal barrier, wherein the thermal barrier divides the interior of the housing into a hot chamber and a cold chamber;
the light-transparent reservoir located in the hot chamber of the housing;
at least one alkali metal thermal-to-electric converter (AMTEC) cell disposed within the thermal barrier such that one end of the AMTEC cell is located in the cold chamber and another end of the AMTEC cell is located in the hot chamber; and
an artery return channel that allows for the liquid to return from the cold chamber to the hot chamber.

4. The internally heated energy generating system of claim 3, wherein the at least one heating unit further comprises an additional heating device that generates heat,
wherein the additional heating device is attached to the end of the AMTEC cell that is located in the hot chamber, and
wherein the additional heating device is able to heat the liquid.

5. The internally heated energy generating system of claim 1, wherein the fin is manufactured from metal.

6. The internally heated energy generating system of claim 1, wherein the at least one heating unit further comprises an additional heating device that generates heat;
wherein one end of the additional heating device is submerged into the liquid, thereby allowing the additional heating device to heat the liquid.

7. The internally heated energy generating system of claim 1, wherein the at least one heating unit further comprises a heating element that generates heat,
wherein the heating element is attached to an outside of the light-transparent reservoir, plated to the outside of the light-transparent reservoir, mounted to the outside of the light-transparent reservoir, attached to an inside of light-transparent reservoir, plated to the inside of the light-transparent reservoir, or mounted to the inside of the light-transparent reservoir, and
wherein the heating element is able to heat the liquid.

8. The internally heated energy generating system of claim 7, wherein the heating element comprises a transparent conductor material.

9. The internally heated energy generating system of claim 8, wherein the transparent conductor material comprises one of indium tin oxide or a conductive nanoparticles material in a carrier coating.

10. The internally heated energy generating system of claim 1, wherein the liquid alkali metal is one of liquid sodium (Na), liquid lithium (Li), liquid potassium (K), or liquid rubidium (Rb).

11. A method for providing an internally heated energy generating system, the method comprising:
providing an energy generating device, a housing, a light-transparent reservoir that comprises a material that is transparent to sunlight rays and that forms a portion of a curved exterior side of the housing, and at least one heating unit;
entering, by the sunlight rays, into the housing by penetrating through the curved exterior side of the housing;
generating, by a heating device of the at least one heating unit, heat to preheat the energy generating device to expedite a startup time of the energy generating device to increase efficiency of a production of energy; and
heating, by the heating device via a fin connected to an end of the heating device wherein an opposite end of the fin is submerged in a liquid contained within the light-transparent reservoir, the liquid, wherein the liquid is a liquid alkali metal.

12. The method for providing an internally heated energy generating system of claim 11, wherein the energy generating device comprises a concentrated solar power (CSP) thermal absorber.

13. The method for providing an internally heated energy generating system of claim 12, wherein the concentrated solar power (CSP) thermal absorber comprises:
the housing that comprises a thermal barrier, wherein the thermal barrier divides the interior of the housing into a hot chamber and a cold chamber;
the light-transparent reservoir located in the hot chamber of the housing;
at least one alkali metal thermal-to-electric converter (AMTEC) cell disposed within the thermal barrier such that one end of the AMTEC cell is located in the cold chamber and an other end of the AMTEC cell is located in the hot chamber; and
an artery return channel that allows for the liquid to return from the cold chamber to the hot chamber.

14. The method for providing an internally heated energy generating system of claim 13, wherein the preheating comprises generating, by an additional heating device of the at least one heating unit, heat,
wherein the additional heating device is attached to the end of the AMTEC cell that is located in the hot chamber such that the additional heating device heats the liquid.

15. The method for providing an internally heated energy generating system of claim 11, wherein the fin is manufactured from metal.

16. The method for providing an internally heated energy generating system of claim 11, wherein the preheating comprises generating, by an additional heating device of the at least one heating unit, heat,
wherein one end of the additional heating device is submerged into the liquid such that the additional heating device heats the liquid.

17. The method for providing an internally heated energy generating system of claim 11, wherein the preheating comprises generating, by a heating element of the at least one heating unit, heat,
wherein the heating element is attached to an outside of the light-transparent reservoir, plated to the outside of the light-transparent reservoir, mounted to the outside of the light-transparent reservoir, attached to an inside of light-transparent reservoir, plated to the inside of the light-transparent reservoir, or mounted to the inside of the light-transparent reservoir such that the heating element heats the liquid.

18. The method for providing an internally heated energy generating system of claim 17, wherein the heating element comprises a transparent conductor material.

19. The method for providing an internally heated energy generating system of claim 18, wherein the transparent conductor material comprises one of indium tin oxide or a conductor nanoparticles material in a carrier coating.

20. The method for providing an internally heated energy generating system of claim 11, wherein the liquid alkali metal comprises one of liquid sodium (Na), liquid lithium (Li), liquid potassium (K), or liquid rubidium (Rb).

21. An internally heated energy generating system, comprising:
   a housing;
   a light-transparent reservoir, comprising a material that is transparent to sunlight rays, that forms a portion of a curved exterior side of the housing and is configured to allow the sunlight rays to enter into the housing by penetrating through the curved exterior side of the housing;
   an energy generating device; and
   at least one heating unit configured to heat the energy generating device to produce energy to create a thermal battery,
wherein the at least one heating unit comprises a heating device that generates heat and a fin, wherein one end of the fin is connected to an end of the heating device and an opposite end of the fin is submerged into a liquid contained within the light-transparent reservoir, thereby allowing the heating device to heat the liquid via the fin, wherein the liquid is a liquid alkali metal.

22. The internally heated energy generating system of claim 21, wherein the liquid alkali metal is one of liquid sodium (Na), liquid lithium (Li), liquid potassium (K), or liquid rubidium (Rb).

23. The internally heated generating system of claim 21, wherein the at least one heating unit further comprises a heating element that generates heat, wherein the heating element is attached to an outside of the light-transparent reservoir, plated to the outside of the light-transparent reservoir, mounted to the outside of the light-transparent reservoir, attached to an inside of the light transparent reservoir, plated to the inside of the inside of the light-transparent reservoir, or mounted to the inside of the light-transparent reservoir, and wherein the heating element is able to heat the liquid.

24. The internally heated energy generating system of claim 23, wherein the heating element comprises a transparent conductor material.

* * * * *